(12) United States Patent
Rouse et al.

(10) Patent No.: US 8,709,289 B2
(45) Date of Patent: Apr. 29, 2014

(54) HIGH CONDUCTIVE WATER-BASED SILVER INK

(75) Inventors: Jason Hayden Rouse, Jersey City, NJ (US); Dave Klein, Wayne, NJ (US)

(73) Assignee: Sun Chemical Corporation, Parsippany, NJ (US)

( * ) Notice: Subject to any disclaimer, the term of this patent is extended or adjusted under 35 U.S.C. 154(b) by 894 days.

(21) Appl. No.: 12/439,995

(22) PCT Filed: Sep. 7, 2007

(86) PCT No.: PCT/US2007/077859
§ 371 (c)(1),
(2), (4) Date: Mar. 4, 2009

(87) PCT Pub. No.: WO2008/031015
PCT Pub. Date: Mar. 13, 2008

(65) Prior Publication Data
US 2011/0155812 A1    Jun. 30, 2011

Related U.S. Application Data

(63) Continuation of application No. 11/530,359, filed on Sep. 8, 2006.

(51) Int. Cl.
*H01B 1/00* (2006.01)
*H01B 1/06* (2006.01)
*H01B 1/02* (2006.01)
*H01B 1/22* (2006.01)

(52) U.S. Cl.
USPC ............ 252/500; 252/512; 252/513; 252/514

(58) Field of Classification Search
USPC .......... 428/408, 328; 252/500, 514, 511, 513; 101/129, 463.1; 427/117
See application file for complete search history.

(56) References Cited

U.S. PATENT DOCUMENTS

| | | |
|---|---|---|
| 4,592,961 A | 6/1986 | Ehrreich |
| 5,286,415 A | 2/1994 | Buckley et al. |
| 5,389,403 A | 2/1995 | Buckley et al. |
| 5,492,653 A | 2/1996 | Hochheimer et al. |
| 5,622,547 A | 4/1997 | Maslowski et al. |
| 5,653,918 A | 8/1997 | Towlson |
| 5,658,499 A | 8/1997 | Steinberg et al. |
| 5,696,196 A | 12/1997 | DiLeo |
| 5,756,008 A | 5/1998 | Slutsky et al. |
| 5,855,820 A | 1/1999 | Chan et al. |
| 6,190,846 B1 * | 2/2001 | Majumdar et al. ............ 430/529 |
| 6,270,884 B1 * | 8/2001 | Guhde et al. .................. 428/323 |
| 6,322,620 B1 | 11/2001 | Xiao |
| 6,410,637 B1 | 6/2002 | Odell et al. |
| 6,576,336 B1 | 6/2003 | LeGrande |
| 6,866,799 B2 * | 3/2005 | Orsbon et al. ................ 252/511 |
| 6,939,484 B2 | 9/2005 | Dorfman |
| 2003/0151028 A1 | 8/2003 | Lawrence et al. |
| 2003/0209697 A1 | 11/2003 | Orsbon et al. |
| 2004/0144958 A1 | 7/2004 | Conaghan et al. |
| 2005/0040934 A1 | 2/2005 | Shanton |

FOREIGN PATENT DOCUMENTS

| | | |
|---|---|---|
| DE | 100 10 538 A1 | 9/2001 |
| EP | 0 230 303 A2 | 7/1987 |
| EP | 0 230 303 A3 | 7/1987 |
| EP | 1 271 671 A1 | 1/2003 |
| JP | 06-080915 A | 3/1994 |
| WO | WO-03/078531 A1 | 9/2003 |
| WO | WO-2005/056702 A1 | 6/2005 |
| WO | WO 03/130980 | 12/2006 |

* cited by examiner

*Primary Examiner* — Monique Peets

(57) ABSTRACT

Disclosed is a conductive composition which can be used to form an aqueous conductive ink with increased conductivity. A film of the dry ink having a thickness of 5 microns or less has a surface roughness of less than 1.5 times the surface roughness of a cellulosic-based substrate which it coats. The aqueous conductive composition contains conductive particles, preferably silver, an anionic wetting agent and a styrene-acrylic copolymer. The composition is highly conductive and requires reduced drying energy. In addition, it may be applied to low cost substrates by high speed printing processes.

20 Claims, No Drawings

US 8,709,289 B2

HIGH CONDUCTIVE WATER-BASED SILVER INK

FIELD OF INVENTION

The present invention relates generally to electrically conductive aqueous coating compositions having improved properties. The dried coating has use in various electronic, shielding, and radio frequency identification (RFID) applications. The compositions are particularly useful as inks for high speed printing to produce electronic circuitry such as RFID antennas etc.

BACKGROUND OF THE INVENTION

Electrically conductive coatings are much in demand by the electronics industry. They are used to protect business equipment from electronic interference (EMI/RFI shielding) to forming complex electronic circuitry on printed circuit boards to antennas for radio frequency identification in applications ranging from warehouse storage of merchandise to U.S. Passports. Electrically conductive printings inks, among the various conductive coatings extant, are growing in demand and, in terms of the variety of application methods and compositions needed to meet the application demands, constitute the paradigm of that coatings class.

Thus, electrically conductive inks are used by the printed electronics industry in order to form conductive elements such as RFID antennas or lines on printed circuit boards. Conductive inks in use today consist essentially of an organic polymer matrix containing, dispersed therein, metal powders, metal powder precursors (metallic decomposition compounds), metal coated fine particles or other conductive particles such as graphite powder. The inks may also contain, usually in low concentration, additives whose role is to maintain/improve stability (for instance, setting agents) or control flow to allow easy application (for instance, solvents), etc. The key property of conductivity is adjusted by controlling the concentration of the metallic powders, its value being proportional, albeit not linearly, to the metal/carrier ratio. Conductive ink compositions are usually applied to a substrate using either low speed processes (e.g., screen printing) or high speed processes (e.g., rotary screen, flexography, gravure), the latter offering the advantage of lower processing cost per print.

The majority of conductive ink compositions in use today are solvent-based thick film systems designed for low speed screen printing (See, e.g., U.S. Pat. Nos. 6,322,620, 4,592, 961, 5,622,547, 5,653,918, and 6,939,484. One popular method for printing RFID antennas and the like is screen printing silver-based inks on plastic, paper or cardboard substrates, and then heating to drive off solvent and cure or anneal the ink to thereby form conductive lines with a thickness over 10 micrometers. However, such compositions have many drawbacks. In addition to environmental issues associated with solvent-based systems, thick film applications require considerable thermal energy for drying. They frequently require high drying and curing temperatures and relatively long drying and curing times. Moreover, such a process requires the substrate to be highly heat stable to permit removal of the solvent and curing/annealing of the ink. Therefore, paper, cardboard substrates, and low glass transition (Tg) temperature polymeric substrates, are not easily adaptable as substrates because they cannot withstand high temperatures, even though they may be cost-effective. Other conductive ink systems that can be printed using high speed processes (e.g., gravure) also require high temperature curing conditions (typically over 150° C.). See, e.g., US Pat. Pub. No. 2004/0144958 A1.

Aqueous conductive inks and coatings offer significant ecological advantages over solvent-based compositions, as the latter release solvents into the atmosphere on drying. Aqueous conductive inks, however, have hitherto not offered the high conductivity, or low electrical resistivity, achievable with solvent-based formulas. See, e.g., U.S. Pat. Nos. 5,286, 415, 5,389,403, 5,492,653, 5,658,499, 5,756,008, 5,855,820, 6,410,637, 6,576,336, and 6,866,799. High conductivity is necessary to insure that the ink will carry a sufficient electric current when cured. While higher conductivity is conventionally achieved by increasing the concentration of the conductive powder (typically silver), this approach often entails performance as well as economic penalties such as decreased shelf-life and increased cost.

Other desired properties of conductive inks include good abrasion and chemical resistance when dried/cured/annealed so that they are not easily scratched or wiped off during subsequent uses. Therefore, the conductive ink should acceptably adhere to the substrate when dried/cured/annealed and resist being wiped off by a solvent. Furthermore, for high-speed printing (e.g. rotary screen, flexography, gravure), it is necessary that the conductive ink have proper rheology and substrate wetting properties to obtain good ink transfer and graphic reproduction. Additionally, the ink should possess good flexibility and thermal stability to withstand the physical deformation to which the substrate may be subjected. A smooth and uniform layer, i.e., having a low surface roughness, is also highly desirable, especially in applications involving antenna construction.

Accordingly, there is a need for an aqueous conductive ink with high conductivity, good printability, low surface roughness, short drying and curing times at low drying and curing temperatures for use with high speed printing processes (e.g., rotary screen, flexography, gravure). Conductive inks with other desired properties would be further advantageous. The present invention provides a family of electrically conductive compositions suitable for use as coatings and especially as high-speed inks, which possess the desirable properties/characteristics.

SUMMARY OF THE INVENTION

The present invention provides a water-based conductive ink which provides a ratio of an ink layer surface roughness to cellulosic-based substrate surface roughness of 1.5 or less, preferably 1.25 or less, and preferably, a sheet resistance of less than 200 milliohm/square, more preferably less than 150 milliohm/square, and most preferably less than 120 milliohm/square. The ink layer with this surface roughness can provide an UHF RFID antenna read range of at least 3 meters. This can be achieved, for example, by ignoring conventional wisdom which dictates that maximizing the number of conductive particles in a composition produces the highest level of conductivity, and providing a conductive composition whose matrix is a water soluble acrylic copolymer capable of dispersing conductive particles, the addition of an anionic wetting agent also substantially increases the conductivity of printed lines and/or graphics. For instance, printing electrically conductive graphics with line spacing of less than about 500 micrometer (particularly less than about 300 micrometer) and with less than 140 milliohm/sq sheet resistance can be realized.

This invention more specifically relates to an aqueous conductive composition such as an ink suitable for use in RFID and other electronic technologies. The composition is highly conductive and requires reduced drying energy. In addition, it may be applied to low cost substrates via high speed printing processes. An example of a conductive composition of this invention comprises (meth)acrylic copolymer or salt thereof, conductive particles, an anionic surface wetting agent, defoamer, water and optionally other solvents.

Four primary frequency ranges for RFID applications are low frequency (LF) (100 to 140 kHz), high frequency (HF) (~13.56 MHz), ultra-high frequency (UHF) (800 to 1000 MHz) and microwave (~2.45 GHz). The invention is useful in connection with RFID antennas, particularly those operating in the UHF spectrum. Importantly, due to recent mandates from the US military and large retailers for RFID labeling of items, UHF antennas are normally used in conjunction with RFID integrated circuit chips that are compliant with the EPCGlobal developed Class 1/Gen 2 protocol standard. The Gen 2 standard allows the data contained within the chip to be read multiple times over the broad frequency range that encompasses North America, Japan, and European standards.

RFID integrated circuit chips are normally attached to the antenna either by directly attaching the chip to the antenna using adhesive (conductive or non-conductive) or by attaching to the antenna a strap which contains the chip pre-mounted onto two conductive pads (normally in conjunction with a conductive adhesive). Companies selling UHF chips are Impinj, Texas Instrument, STM Micro, Philips Electronics while Alien Technology and Texas Instrument provide straps. A different technology to produce EPC Gen 2 compliant antennas has been developed by Tagsys RFID. The Tagsys RFID AK Kernel system utilizes an EPC Class 1/Gen 2 UHF compliant chip mounted onto a small (12 mm by 8 mm) primary antenna. The AK Kernel module is then applied either on top of or near to a larger secondary antenna using normally a non-conductive adhesive so that no direct contact exists between the primary and secondary antennas. The function of the secondary antenna is to absorb the UHF energy and transmit it to the "Kernel module".

These and other aspects will become apparent upon reading the following detailed description of the invention.

DETAILED DESCRIPTION OF THE INVENTION

The present invention provides a water-based conductive composition suitable for use as a high speed printing ink with desirable properties, particularly high conductivity, printability on low cost substrates (e.g., cellulosic and low Tg plastics) and having low thermal energy requirements for drying and curing/annealing, the dry ink in a layer of up to 5 microns provides a ratio of ink surface roughness to the surface roughness of a cellulosic-based substrate of about 1.5 or less, preferably about 1.25 or less. Surprisingly, the dry ink with this roughness can provide a UHF RFID antenna read range of 3 meters or more. Preferably, the print roughness after subtraction of the substrate roughness is less than about 1 micron. It has been discovered that such an ink can be realized by appropriate selection of ink ingredients such as, for example, by combining anionic wetting agents with styrene-acrylic copolymers which synergistically disperses silver particles, providing a substantial increase in the conductivity of printed lines and/or graphics. In addition, the combination of the anionic wetting agent with the styrene-acrylic copolymer produces a conductive ink which gives excellent graphic reproduction, uniform lay-down, shelf-stability, proper rheology, and substrate adhesion. Importantly, the ink provides distinct environmental advantages since it is water-based, i.e., water is the primary solvent/carrier.

The resulting conductive ink composition may be applied to substrates by a variety of techniques such as gravure printing, screen printing, offset printing, lithographic printing, letterpress printing, spraying, brushing (painting), or curtain coating. The preferred printing method of application is high speed printing such as rotary screen, flexography, and gravure. High speed printability is important in order to reduce the production costs of electrical circuitry and antennas. However, due to the intricate circuitry patterns often demanded by the electronics industry in high performance applications such as, for example, in the preparation of touch pad circuitry and direct-chip pads used in RFID antenna, it is also important that print resolution be maintained during such high-speed printing.

The unique properties of the inventive composition provide applicability in numerous applications. In addition to the use in RFID antenna construction, the composition can also be used to construct various antenna structures used in both active and passive applications. Formation of printed circuitry using the composition allows uses in items such as touch pads, electronic toys, displays, flexibly wiring, etc. Items containing such printed circuits include computers, monitors, televisions, and automated machinery that are used in various industries ranging from electronics to automotive to industrial settings.

The unique properties of the inventive composition include a ratio of surface roughness of a dry film of the composition having a thickness of 5 microns or less relative to the surface roughness of a cellulosic-based substrate of about 1.5 or less, preferably about 1.25 or less, when the ink film thickness is 5 microns or less. Whether any particular combination of ingredients provides the surface roughness ratio can easily be determined by coating the ink on a substrate, allowing it to dry and then measuring this parameter. The inventive composition also preferably provides a conductivity (sheet resistance) of less than about 200 milliohm/square, preferably less than about 150 milliohm/square, and most preferably less than about 120 milliohm/square.

One composition according to the present invention contains:

(a) conductive particles;
(b) an anionic wetting agent;
(c) styrene/(meth)acrylic copolymer or salt thereof and blends thereof with other (meth)acrylic copolymer resins or salts;
(d) defoamer; and
(e) water.

The preferred conductive particle in the present invention is silver. Preferably, the silver is present as flakes and the flakes have a longest dimension (D90) of about 100 nm to 50 microns, more preferably between 1 to 20 microns, with an aspect ratio of at least 5:1. All particles generally have the same D90, although other sizes can be employed. The dimensions of particles, typically silver flake, is normally determined using light scattering of the particles dispersed in a solvent. Alternatively, the silver may be in the form of spherical particles, granular particles, fibers, grains, or platelets. The particles may be surface treated with at least one straight-chain carboxylic acid or salt of the acid.

However, other conductive metal particles may also be used in the composition of this invention, such as copper, gold, nickel, carbon, graphite, silver alloys, silver plated metals such as silver coated copper and silver coated nickel, silver coated glass, silver coated mica, silver coated graphite, nickel coated carbon, nickel coated graphite, and other conductive particles known in the field. Alternatively, carbon, typically in the form of carbon black or graphite may also be used, along or in combination with the metal particles.

Any known anionic surfactant, or combination of anionic surfactants, can be employed in the present invention. Non-limiting examples of the surfactants useful include the conventional $C_{11-18}$ alkylbenzene sulphonates, the $C_{10-18}$ secondary (2,3) alkyl sulphates of the formula $CH_3(CH_2)_x(CHOSO_3\text{-}M^+)CH_3$ and $CH_3(CH_2)_y(CHOSO_{3\text{-}M}{}^+)CH_2CH_3$ where x and (y+1) are integers of at least about 7, preferably at least about 9, and M is a water-solubilising cation, especially sodium, unsaturated sulphates such as oleyl sulphate, $C_{10-18}$ alkyl alkoxy carboxylates (especially the $EO_{1-7}$ ethoxycarboxylates), the $C_{10-18}$ glycerol ethers, the $C_{10-18}$ alkyl polyglycosides and their corresponding sulphated polyglycosides, and $C_{12-18}$ alpha-sulphonated fatty acid esters.

Other anionic surfactants include salts (including, for example, sodium, potassium, ammonium, and substituted ammonium salts such a mono-, di- and triethanolamine salts) of soap, $C_{9-20}$ linear alkylbenzenesulphonates, $C_{8-22}$ primary or secondary alkanesulphonates, $C_{8-24}$ olefinsulphonates, sulphonated polycarboxylic acids, alkyl glycerol sulphonates, fatty acyl glycerol sulphonates, fatty oleyl glycerol sulphates, alkyl phenol ethylene oxide ether sulphates, paraffin sulphonates, alkyl phosphates, isothionates such as the acyl isothionates, N-acyl taurates, fatty acid amides of methyl tauride, alkyl succinamates and sulphosuccinates, monoesters of sulphosuccinate (especially saturated and unsaturated $C_{12-18}$ monoesters) diesters of sulphosuccinate (especially saturated and unsaturated $C_{6-14}$ diesters), N-acyl sarcosinates, sulphates of alkylpolysaccharides such as the sulphates of alkylpolyglucoside, branched primary alkyl sulphates, alkyl polyethoxy carboxylates such as those of the formula $RO(CH_2CH_2O)_kCH_2COO^-M^+$ wherein R is a $C_{8-22}$ alkyl, k is an integer from 0 to 10, and M is a soluble salt-forming cation, and fatty acids esterified with isethionic acid and neutralized with sodium hydroxide.

Specific examples of anionic wetting agents include dihexyl sulphosuccinate salt, di-2-ethylhexyl sulfosuccinate salt, dioctyl sulfosuccinate salt, and ionic polyacrylate copolymers used as surface wetting/leveling agents.

Any know styrene-(meth)acrylic copolymer, or combination of copolymers, can be employed in accordance with this invention. The styrene copolymers are prepared by reacting styrene or a substituted styrene with either an acrylate or methacrylate. Frequently, the styrene copolymers are prepared by reacting styrene with a hydroxyalkyl acrylate. Such hydroxyalkyl acrylates have a hydroxy content ranging up to about 25%, e.g., from about 2 to 12% by weight, and include acrylates wherein the alkyl group has from 1 to 12 aliphatic carbon atoms. The hydroxyalkyl acrylates include not only the mono- and polyacrylates or mono- and polymethacrylates such as the mono- or polyhydroxy alkyl di- and triacrylates or alkacrylates, e.g. the methacrylates and ethacrylates, but also the halogen-substituted acrylates such as the chlorine or bromine substituted mono- or polyhydroxy alkyl acrylates, e.g., the mono- or polyhydroxy alkyl chloroacrylates or hydroxychloroalkyl diacrylates or dialkacrylates. These (meth)acrylates may be described as esters of acrylic or substituted-acrylic acid including, for example, 2-hydroxypropyl acrylate, 3-hydroxybutyl acrylate, 4-hydroxypentyl acrylate, 5-hydroxypentyl acrylate, 5-hydroxyhexyl acrylate, 2-hydroxybutyl acrylate, 2-hydroxyethyl methacrylate, 2-hydroxyethyl chloroacrylate, 2-hydroxyethyl acrylate, 2-hydroxyethyl ethacrylate, hydroxybutyl ethacrylate, 3-hydroxypropyl methacrylate, 3-hydroxypropyl chloroacrylate, 3-hydroxybutyl acrylate, 4-hydroxybutyl methacrylate, 3-hydroxybutyl ethacrylate, 3-hydroxypropyl ethacrylate, 3-hydroxybutyl chloroacrylate, 3-hydroxypropyl acrylate, 3-hydroxypropyl 2-chloroacrylate, 4-hydroxybutyl acrylate, 3-hydroxyethyl 2-chloroacrylate, 3-hydroxybutyl chloromethacrylate, 5-hydroxypentyl acrylate, 2-hydroxypropyl chloromethacrylate, 5-hydroxypentyl methacrylate, 6-hydroxyhexyl acrylate, 2-hydroxybutyl chioromethacrylate, 2-hydroxyethyl chloroethacrylate, 3-hydroxybutyl methacrylate, 2-hydroxyethyl chloromethacrylate, 2-hydroxypropyl chloroethacrylate, 2-hydroxybutyl dichloroethacrylate, 2-hydroxybutyl chloromethacrylate, 3-hydroxypropyl chioromethacrylate, 3-hydroxypropyl chloroethacrylate, 3-hydroxyhexyl chioromethacrylate, 3-hydroxypentyl 2-chloroacrylate, 3-hydroxybutyl bromomethacrylate, 2-hydroxybutyl chloromethacrylate, 4-hydroxybutyl 2-chloroethacrylate, 3-hydroxypentyl 2-chloroethacrylate, 3-hydroxypropyl 2-bromoethacrylate, 4-hydroxybutyl 2-bromoethacrylate, 5-hydroxyhexyl methacrylate, 6-hydroxypentyl chioromethacrylate and various other vinyl or acrylic esters containing at least one free alcoholic hydroxyl group, e.g., a mono- or polyhydroxy alkyl ester of acrylic, methacrylic or ethacrylic acid.

Other acrylic esters that may be used have one or more free hydroxyl groups and include polyethylene glycol methacrylate, diethylene glycol methacrylate, triethylene glycol methacrylate, tetraethylene glycol methacrylate, dipropylene glycol methacrylate, tetraethylene glycol chloroacrylate, tetraethylene glycol acrylate, tetraethylene glycol dichloroacrylate, glycerol methacrylate, pentaerythritol methacrylate, diethylene glycol monoacrylate, triethylene glycol monoacrylate, dipropylene glycol monoacrylate, trimethylol ethane diacrylate, trimethylol propane diacrylate, pentaerythritol triacrylate, glycerol acrylate, pentaerythritol monoacrylate, trimethylol ethane monoacrylate, trimethylol propane monoacrylate, trimethylol ethane chloroacrylate, trimethylol propane methacrylate, trimethylol butane methacrylate, tetramethylene glycol chloroacrylate, triethylene glycol methacrylate, tetraethylene glycol acrylate, pentaerythritol dichloroacrylate, dipentaerythritol diacrylate, dipentaerythritol triacrylate pentaerythritol dimethacrylate, pentaerythritol methacrylate and combinations of any of these hydroxy-containing acrylates in various proportions.

Examples of commercially available styrene-acrylic copolymers that can be used in this invention included Joncryl 100, Joncryl 50, Joncryl 682, Joncryl 60, Joncryl 678, Joncryl 85, (all from Johnson Polymers), TruDot IJ-4680, Jonrez 1-2620, Hyatop HS-2734, Hyatop 2720 (all from MeadWestvaco) and blends thereof.

In addition to the foregoing resins, other acrylic resins can also be used in combination with the styrene-acrylic copolymers to add film flexibility. Examples of commercially available acrylic copolymer that can be used in this invention include Joneryl 142, Joneryl 91, Joneryl 85, (all from Johnson Polymers), Morcryl 132 (from Rohm & Haas), Jonrez D-2153 (from MeadWestvaco), as well as blends thereof.

The copolymer(s) is preferably used in the form of a salt which provides or increases water solubility. Suitable salts can be formed with ammonia, amines, alcohols such as methanol, alkali metals such as sodium and potassium, and the like. It is most convenient to use the acrylic copolymers in the form of aqueous resin solutions.

One or more defoamers are employed to avoid obstructive foaming during mixing to prepare the composition and during the printing process. Any known conventional defoamer can be employed. Typical non-limiting examples include Surfynol® DF-659, Surfynol® DF-58, Surfynol® DF-66 (all from Air Products), Foammaster® (from Henkel) BYK®-

019, BYK®-021, BYK®-022, BYK®-025 (all from Byk Chemie), and Dee Fo 215, Dee Fo XRM-1547A (all from Ultra Additives).

If desired, solvents such as alcohols, amines, glycols, acetates, ethers, ketones, aldehydes, amides, and blends thereof can be added to control or modify such things as rheology, drying speed, shelf stability as required. Water remains the primary solvent.

The combination of the present invention generally contains about 10 to 90% conductive particles, preferably about 40 to 75% and most preferably about 50 to 70; about 0.01 to 6% anionic wetting agent, preferably about 0.1 to 3% and most preferably about 0.5 to 2%; about 2 to 50% styrene/(meth)acrylic copolymer, preferably about 2 to 20% and most preferably about 4 to 10%; about 0.01 to 4% defoamer, preferably about 0.1 to 2% and most preferably about 0.2 to 1.5%; and about 10 to 80% water, preferably about 20 to 65%, and most preferably about 25 to 35%; with the balance being other ingredients such as those described above. The copolymer to water ratio is preferably about 4 to 1 to 1 to 8. The composition may also be provided as a concentrate to be combined with the other ingredients. In that case, the conductive particles may be present in an amount of about 20 to 95% by weight, preferably about 40 to 80%, and more preferably about 60 to 70%; the styrene-acrylic copolymer about 5 to 50% by weight, preferably about 6 to 45% and most preferably about 7.5 to 30%; about 0.05 to 5% defoamer, preferably about 0.2 to 3% and most preferably about 0.3 to 2%; and the anionic surfactant is about 0.01 to 5% by weight, preferably about 0.1 to 3%, and more preferably about 0.1 to 1.5%. The concentrate may also contain other of the ink ingredients. Other conventional components may be present in the conductive composition. These include viscosity modifiers, drying retarding agents, flow additives, adhesion promoters and rheology modifies. These, and other additives, may be used singularly or in various combinations with each other.

The composition can be prepared using a number of methods. The preferred method of producing the composition is to add the various components to a container and mix the components via a high speed mixer to form the finished composition. Alternatively, the conductive particles (i.e. silver flake) can be dispersed into the acrylic copolymer via high speed mixing, ball milling, 3-roll milling, extrusion, etc. to form in some cases a concentrate to which the anionic wetting agent, defoamer, water and other solvents can be added to make the finished composition.

Methods of applying the composition to a substrate to form a conductive layer include coating, spraying, printing, and painting. Printing techniques applicable to this composition include letterpress, screen, rotary screen, gravure, and flexographic printing. Cylinder printing, direct or indirect, such as flexographic printing, is preferred and methods where the composition is forced through a screen is possible but not preferred. The composition can be applied to various types of cellulosic substrates (i.e. paper, cardboard) and plastics such as polyesters, polypropylenes, etc.

The composition once applied to the substrate can be dried using a number of techniques and methods known in the field. For items prepared using a printing technique, the press can be equipped with IR dryers, forced hot air blowers, annealing rollers, or microwave units to remove the water solvent and cure/anneal the ink layer. Alternatively, the printed item could be partially dried on press and then either placed in a drying oven or routed through another drying system to further cure/anneal the ink.

In order to further illustrate the invention, various examples are set forth below, but the particular materials and amounts described in these examples, as well as other conditions and details, are not intended to limit this invention. All parts and percentages are by weight and all temperatures are in degrees Centigrade unless otherwise noted.

Example 1

In order to demonstrate the synergistic effect of adding anionic surface wetting agents to a styrene-acrylic copolymer on the conductivity of the printed layer, 16 wetting agents with various chemistries were added to a water based flexographic conductive ink formulation containing 63% silver flake (Ferro Corp)., 26% styrene-acrylic copolymer resin (27 wt % resin, ammonium salt, MeadWestvaco), 1% defoamer (Ultra Additives), and 10% water by weight. The amount of the wetting agent added to the base composition was 1.0-1.2% in all cases. The resulting ink was applied to a PET sheet using a 95Q flexographic handproofer, dried, and the sheet resistance measured. A Loresto-EP low resistivity meter with an ASP 4-point probe was used to measure the sheet resistance of 2 by 4 inch samples cut from the handproofs. The results are shown in Table 1.

TABLE 1

| Wetting Agent | Functional Type | Conductivity (sheet resistance) (ohms/square) |
|---|---|---|
| None | NA | 0.21 |
| BYK 381 (polyacrylate copolymer) | Anionic | 0.13 |
| Hydropalat 875 (di-2-ethylhexyl sulfosuccinate, Na salt) | Anionic | 0.15 |
| Hydropalat 680 (dihexyl sulfosuccinate, Na salt) | Anionic | 0.18 |
| BYK 333 (polyether modified polydimethyl siloxane) | Non-ionic | 0.20 |
| BYK 345 (polyether modified polydimethyl siloxane) | non-ionic | 0.20 |
| EDAPLAN LA 411 (modified siloxane-glycol copolymer) | Non-ionic | 0.25 |
| BYK 348 (polyether modified polydimethyl siloxane) | Non-ionic | 0.26 |
| Surfynol 104PA (acetylenic diol) | Non-ionic | 0.22 |
| Surfynol 2502 (alkoxylated acetylenic diol) | Non-ionic | 0.27 |
| Surfynol SE-F (ethoxylated acetylenic diols) | Non-ionic | 0.26 |
| Surfynol 440 (ethoxylated acetylenic diol) | Non-ionic | 0.25 |
| Surfynol 420 ethoxylated acetylenic diols | Non-ionic | 0.27 |
| Metolat FC 388 (blend of polyglycolesters; diol ester) | Non-ionic | 0.32 |
| BYK 380N (polyacrylate) | Nonionic | 0.21 |
| Starfactant 20 (organic polymer) | Non-ionic | 0.22 |

As can be observed, only the use of anionic wetting agents results in a significant improvement in conductivity. Use of the other wetting agents provided no significant improvement in conductivity or even resulted in a decrease in performance (i.e., higher resistivity).

Example 2

To further illustrate that adding anionic wetting agents to styrene-acrylic copolymers results in a decrease in surface resistivity of the printed ink, the anionic wetting agents BYK 381 and Hydropalat 875 were added to a styrene-acrylic copolymer from Johnson Polymer. As in Example 1, a base composition comprising resin, silver flake, defoamer, and water was prepared and the anionic wetting agent added to this composition. The composition of the ink base is presented in Table 2. The base was prepared by mixing the following components at 6,000 rpm for 10 minutes with a Dispermat mixer.

TABLE 2

| Ingredient | Parts |
| --- | --- |
| Styrene-acrylic copolymer (Johnson Polymer) | 20.1 |
| Silver flake (Ferro Corp.) | 65.0 |
| Defoaming agent (Ultra Additives) | 0.24 |
| Water | 14.66 |

To the base composition in Table 2, 1 weight % BYK 381 was added. The composition was then applied to a PET substrate using a 95Q handproofer and dried, and sheet resistance measured. Compared to a sheet resistance of 1.22 ohm/sq obtained on the base composition without wetting agent, the composition containing BYK 381 had a sheet resistance of 0.38 ohm/sq. When 2 wt % Hydropalat 875 was added to the same base composition, the sheet resistance of the dried film was 0.83 ohm/sq. These results further demonstrate the synergistic effect that adding anionic wetting agents to styrene-acrylic resin/silver particles coatings on the conductivity of the dried film.

Example 3

The following example further illustrates typical properties of the inks of the present invention. A water based silver conductive ink was prepared by mixing the following components at 6,000 rpm for 10 minutes with a Dispermat mixer.

TABLE 3

| Ingredient | Parts |
| --- | --- |
| Styrene-acrylic copolymer (MeadWestvaco) | 25.9 |
| Anionic wetting agent (BYK-381) | 1.25 |
| Silver flake (Ferro Corp.) | 62.6 |
| Defoaming agent (Ultra Additives) | 0.25 |
| Water | 10 |
| Viscosity (Zahn cup #3@ 25° C.) | 30-35 seconds |

The ink was applied to a PET substrate and to a paper substrate and gave sheet resistance values of 0.12 and 0.10 ohms/sq after drying for a layer thickness of 3 to 5 microns (i.e. a volume resistivity between 30 and 60 microohms.cm).

The same ink but formulated without the anionic wetting agent exhibited a viscosity of 24-26 seconds, and sheet resistance values above 0.25 ohms/sq after drying (i.e. a volume resistivity above 125 microohms.cm).

Example 4

In order to demonstrate the suitability of the composition for printing RFID antennas, an UHF RFID antenna configuration (Alien "I") was printed using a flexographic press on a 60 lb coated paper substrate using the ink of Example 3. The resulting antennae were connected to Class 1/Generation 1 UHF RFID straps (chip attached to two conductive pads) from Alien Technologies with a 2-component silver epoxy conductive adhesive. Using a Alien ALR9800 reader, the resulting UHF RFID tags were detectable at a range exceeding 3 meters. Additionally, EPC compliant Class 1/Gen 2 UHF RFID straps from Alien Technologies were also attached to the printed "I" antenna and the resulting antennae could be read at a distance of over 2 meters and with read rates of about 600 per second at shorter distances.

Example 5

To further illustrate the high-speed and high-resolution capabilities of the inventive composition for printing electronic circuitry, the composition in Example 3 was printed at 150 FPM on a flexographic press using flexographic plates containing a rectangular graphic for sheet resistance measurements and the "Thin Propeller" UHF RFID antenna design from Impinj, Inc. The "Thin Propeller" is designed for direct-chip attachment and therefore contains contact pads that are only separated by 300 microns. On 60 lb coated paper the direct-chip attachment pads we successfully printed with any shorting of the circuits via pad-to-pad contacts. The sheet resistance measured under these print conditions was 0.12 ohm/sq. An Impinj Monza EPC compliant Class 1/Gen 2 UHF RFID integrated circuit chip was attached to the printed "Thin Propellor" antenna at the direct chip attachment points using an epoxy adhesive. The resulting antenna was read at a distance of about 2 meters using an Alien ALR9800 reader.

Example 6

To further demonstrate the suitability of the composition for printing RFID antennas that do not require a direct connection between the conductive antenna and the RFID integrated circuit chip, experiments were conducted using the AK Kernel system from Tagsys RFID. Using antenna designs similar to that found in FIGS. 5 (a fashion price tag) and 6 (a box) of the AK Tag Warm-Up Kit Revision 1.0 (February 2006) antennas were printed on a flexographic press using the ink in Example 3 on both PET (Melinex 359) and 60 lb coated paper. AK Kernels attached to the antenna designs similar to that in FIG. 5 printed on both PET and coated paper were read at about 1 meter and similar to FIG. 6 were read at about 3 meters using an Alien ALR9800 reader.

Example 7

To further illustrate the applicability of the inventive composition to be applied by other techniques the composition in Table 4 was prepared by mixing at 2000 RPM for 20 mins on a Dispermat mixer.

TABLE 4

| Ingredient | Parts |
| --- | --- |
| Styrene-acrylic copolymer (MeadWestvaco) | 25.4 |
| Anionic wetting agent (BYK-381) | 1.2 |
| Silver flake (Ferro Corp.) | 61.4 |
| Defoaming agent (Ultra Additives) | 1.0 |
| Water | 6.0 |
| N-butyl carbitol | 5.0 |

The composition of Table 4 was flat-bed screen printed using a 77T screen onto Melinex ST505 PET substrate then dried at 120C for 5 minutes. The dried ink layer was about 7 microns in thickness and produced a sheet resistance of 0.080 ohms/sq (22 milliohm/sq at 25 microns thickness). Therefore, the prints produced in this example could be used in various electronic applications such as circuitry in printed circuit boards or HF/UHF RFID antennas, for example.

Example 8

To further illustrate that the inventive composition is applicable to coatings containing non-silver flake particles, a composition containing silver-coated glass flakes in a styrene-acrylic matrix was tested. The composition tested contained 44.9% silver-coated glass flake (Potters Industries), 37.7% styrene-acrylic copolymer resin (27 wt % resin, ammonium salt, MeadWestvaco), 0.2% defoamer (Ultra Additives), and 16.5% water by weight and was prepared by mixing at 2000 RPM for 20 min on a Dispermat mixer. To this composition 3.0 wt % of wetting agents of various chemistries was added (Table 5).

TABLE 5

| Wetting Agent | Functional Type | Conductivity (sheet resistance) (ohms/square) |
|---|---|---|
| None | NA | 4.78 |
| Metolat 285 (dioctyl sulfosuccinate, Na salt) | Anionic | 1.29 |
| Hydropalat 875 (di-2-ethylhexyl sulfosuccinate, Na salt) | Anionic | 1.39 |
| BYK 348 (polyether modified polydimethyl siloxane) | Non-ionic | 200 |
| Surfynol 420 (ethoxylated acetylenic diols) | Non-ionic | 8944 |
| Metolat FC 388 (blend of polyglycolesters; diol ester) | Non-ionic | 3.20 |
| BYK 380N (polyacrylate) | Nonionic | 3.91 |
| Starfactant 20 (organic polymer) | non-ionic | 2.11 |

The resulting ink was applied to a PET sheet using a 95Q flexographic handproofer, dried, and the sheet resistance measured. As can be observed, the anionic wetting agents resulted in the most significant improvement in conductivity. The other wetting agents showed either minor improvement in conductivity or resulted in a decrease in performance (i.e., higher resistivity).

Example 9

To illustrate the unique low surface roughness properties of the invention and that the desired surface roughness can be achieved by appropriate formulation, the surface roughness of the ink in Example 3 printed by flexography on coated paper (60 lb C1s from Appleton Coated) was compared to that of a commercially available sample of a water-based silver ink printed by flexography on a coated paper having a smoother surface (and thus contributing less roughness to the printed ink). Surface roughness was measured on a WYKO NT1100 Optical Profiling System at a magnification of 2.5× using the VSI mode with two (2) scans averaged. Root mean square (RMS) roughness (Rq) was calculated by averaging five (5) separate spots on the respective prints. The average RMS roughness obtained on the prints made with the ink of Example 3 was 1.92 microns on the substrate which had a roughness of 1.54 microns, a ratio of print roughness to substrate roughness of 1.15. The comparison ink gave a higher average RMS roughness of 2.95 microns on a substrate with lower roughness (1.27 microns), a ratio of print roughness to substrate roughness of 2.32.

Example 10

To further illustrate ability of the invention to produce low surface roughness prints, the ink in Example 3 was printed on a plastic substrate (Melinex 359 from Dupont) by flexography. The RMS roughness of prints were only 0.88 microns with the substrate having a roughness of 0.57 microns, for a ratio of 1.54.

Example 11

To illustrate the positive effect that the low surface roughness has on UHF RFID antenna read range, the ink of Example 3 was printed by flexography in the shape of an Alien "I" antenna on various substrates. The resulting antennae were connected to Class 1/Generation 1 UHF RFID straps (chip attached to two conductive pads) from Alien Technologies with a 2-component silver epoxy conductive adhesive. Using an Alien ALR9800 reader, the resulting UHF RFID tags were detectable at a range exceeding 4 meters. Details are set forth in Table 6 below. The low (<1.15) print roughness to substrate roughness obtained coupled with the measured read range of the antenna illustrates the unique ability of the invention to produce uniform conductive layers that function as antenna even on uncoated substrates.

TABLE 6

| Substrate | Print Roughness (RMS) (microns) | Substrate Roughness (RMS) (microns) | Print Roughness/ Substrate Roughness Ratio | Read Range (m) |
|---|---|---|---|---|
| Coated paper (60 lb C1S, Appleton Coated) | 1.92 | 1.54 | 1.15 | 4 |
| Uncoated side of paper (60 lb C1S, Appleton Coated) | 3.25 | 3.8 | 0.86 | 4 |
| Uncoated side of Direct Thermal paper (Resiste-200-3.2, Appleton Ideas) | 2.87 | 3.35 | 0.86 | 4 |
| Coated liner board (Printkote PMT, MeadWestvaco) | 1.23 | 1.19 | 1.05 | 4 |

While the invention has been described above with reference to specific embodiments thereof, it is apparent that many changes, modifications and variations can be made without departing from the spirit and scope thereof. Accordingly, it is intended to embrace all such changes, modifications and variations that fall within the spirit and broad scope of the foregoing description.

What is claimed is:

1. A conductive composition comprising:
   (a) conductive particles;
   (b) styrene/(meth)acrylic copolymer;
   (c) an anionic wetting agent;

(d) defoamer; and (e) 10 to 80% water, wherein water is a primary solvent for the conductive composition.

2. The conductive composition of claim 1, which is water-based and when dry, a 5 micron or less layer on a cellulosic substrate has a ratio of surface roughness to substrate roughness of not more than 1.5.

3. The conductive composition of claim 2 having a sheet resistance of not more than 200 milliohm/square when dry and having a thickness of 5 micron or less.

4. The conductive composition of claim 2 having, when dry, a RFID antenna read range of at least 3 meters.

5. The conductive composition of claim 2, wherein the conductive particles comprise silver.

6. The conductive composition of claim 5, wherein the longest dimension of said silver particles is from about 100 nm and 50 micrometers.

7. The conductive composition of claim 6, wherein the longest dimension of said silver particles is from about 1 to 20 micrometers.

8. The conductive composition of claim 2, wherein the styrene/(meth)acrylic copolymer is a copolymer of styrene and an alkyl (meth)acrylate, optionally partly hydrolyzed or salified.

9. The conductive composition of claim 2, wherein the copolymer to water has a ratio of about 4 to 1 to 1 to 8.

10. The conductive composition of claim 2, wherein the styrene/(meth)acrylic copolymer comprises a blend with an alkyl (meth)acrylate copolymer.

11. The conductive composition of claim 10 wherein the alkyl moieties comprise at least one of ethyl, propyl, butyl, and hexyl.

12. The conductive composition of claim 2, wherein the anionic wetting agent is selected from the group consisting of alkali sulphosuccinate, alkali sulfosuccinate, and anionic polyacrylate copolymer.

13. The conductive composition of claim 2, wherein the anionic wetting agent is selected from the group consisting of dihexyl sulphosuccinate salt, di-2-ethylhexyl sulfosuccinate salt, and dioctyl sulfosuccinate salt.

14. The conductive composition of claim 2, further comprising at least one solvent selected from the group consisting of alcohols, amines, glycols, acetates, ethers, ketones, aldehydes, and amides.

15. The conductive composition of claim 5, where the silver is about 10 to 90% of the composition, the copolymer is about 2 to 50%, the defoamer is about 0.01 to 4%, and the anionic wetting agent is about 0.01 to 6% by weight.

16. The conductive composition of claim 15, where the silver is about 40 to 75% of the composition, the copolymer is about 2 to 20%, the defoamer is about 0.1 to 2%, and the anionic wetting agent is about 0.1 to 3% by weight.

17. The conductive composition of claim 16, where the silver is about 50 to 70% of the composition, the copolymer is about 4 to 10%, the defoamer is about 0.2 to 1.5%, and the anionic wetting agent is about 0.5 to 2% by weight.

18. The conductive composition of claim 17, wherein the longest dimension of said silver particles is from about 100 nm and 50 micrometers, the styrene/(meth)acrylic copolymer is a copolymer of styrene and an alkyl (meth)acrylate, optionally partly hydrolyzed or salified; the anionic wetting agent is selected from the group consisting of alkali sulphosuccinate, alkali sulfosuccinate, and anionic polyacrylate copolymer; the copolymer to water has a ratio of 4:1 to 1:8; and the composition has a Zahn cup #3 viscosity in the range of about 10 to 40 seconds.

19. The conductive composition of claim 2, having a Zahn cup #3 viscosity in the range of about 10 to 40 seconds.

20. The conductive composition of claim 2, wherein the conductive particles are at least one member selected from the group consisting of copper, gold, nickel, carbon, graphite, silver alloys, silver coated metal, silver coated glass, silver coated mica, silver coated graphite, nickel coated carbon, and nickel coated graphite.

* * * * *